United States Patent
Suzaki

[11] Patent Number: 5,995,371
[45] Date of Patent: Nov. 30, 1999

[54] INTEGRATED DIELECTRIC SUBSTRATE

[75] Inventor: Hidefumi Suzaki, Nagaokakyo, Japan

[73] Assignee: Murata Manufacturing Co., Ltd., Japan

[21] Appl. No.: 08/933,484

[22] Filed: Sep. 18, 1997

[30] Foreign Application Priority Data

Sep. 19, 1996 [JP] Japan ................................. 8-269236

[51] Int. Cl.⁶ ................................................. H05K 7/20
[52] U.S. Cl. ........................... 361/719; 257/707; 361/711
[58] Field of Search .................................... 361/704, 707, 361/709–711, 712, 761, 717–719; 174/16.3, 252; 165/80.3, 185; 257/703, 707, 713, 722

[56] References Cited

U.S. PATENT DOCUMENTS

| | | |
|---|---|---|
| 4,630,172 | 12/1986 | Stenerson . |
| 4,729,061 | 3/1988 | Brown . |
| 4,812,949 | 3/1989 | Fontan . |
| 4,859,805 | 8/1989 | Kawakami . |
| 4,866,571 | 9/1989 | Butt . |
| 5,583,377 | 12/1996 | Higgins, III ........................... 257/707 |
| 5,629,835 | 5/1997 | Mahulikar . |
| 5,731,067 | 3/1998 | Asai . |

FOREIGN PATENT DOCUMENTS 6181396  6/1994  Japan ..................................... 174/252

*Primary Examiner*—Gerald Tolin
*Attorney, Agent, or Firm*—Ostrolenk, Faber, Gerb & Soffen, LLP

[57] ABSTRACT

An integrated dielectric substrate has a dissipating plate for dissipating the heat generated by an exothermic element mounted above the surface of the dielectric substrate. Either a cavity or a groove is cut through the surface of the dielectric substrate, preferably from one end to the other end of the dielectric substrate, the dissipating plate being fitted in the cavity or groove, both ends of the dissipating plate extending beyond the corresponding ends of the dielectric substrate to form extending end portions, and the exothermic element being mounted on the surface of the dissipating plate.

30 Claims, 4 Drawing Sheets

INTEGRATED DIELECTRIC SUBSTRATE

BACKGROUND OF THE INVENTION

1. Field of the Invention

The present invention relates to an integrated dielectric substrate, and more particularly to a dielectric substrate equipped with a dissipating plate, for mounting an exothermic element (e. g., a high-output transistor or integrated circuit) used for power modules in mobile communication tools, etc.

2. Description of the Related Art

FIG. 8A shows the structure of an integrated dielectric substrate. FIG. 8B is a fragmentary cross sectional view taken along the line A—A in FIG. 8A. The integrated dielectric substrate is composed of: a dielectric substrate 1; metallic blocks 2; a dissipating plate 3; exothermic elements 5 generating a large amount of heat, such as high-output transistors (power transistors) or integrated circuits (ICs); and connecting terminals 7.

As is shown in FIGS. 8A and 8B, the dielectric substrate 1 is mounted on the top face of the dissipating plate 3. The dielectric substrate 1 has through holes 4 corresponding to the number of the exothermic elements 5 to be mounted on the dielectric substrate 1. The metallic blocks 2 are inserted into the corresponding through holes 4 and the bottom face of each metallic block 2 is connected to the dissipating plate 3. The exothermic elements 5 are each mounted on the top face of a respective metallic block 2 according to a one-to-one correspondence. The top-face area of each metallic block 2 is larger than that of the corresponding exothermic element 5. Each of the through holes 4 defines a space between the corresponding metallic block 2 and the substrate 1.

On the surface of the dielectric substrate 1, circuit patterns (not shown in the figure) and land patterns 8 are formed, and also, devices (not shown in the figure) other than the exothermic elements 5 are loaded. The exothermic elements 5 and the land patterns 8 are connected by wires 10 so that the exothermic elements 5 achieve continuity with the predetermined connecting positions of the circuit patterns via the land patterns 8 and wires 10.

The dissipating plate 3 exhibits a high heat conductivity and has terminal portions 11 extending from the ends of the dielectric substrate 1. The heat generated by the exothermic elements 5 is conducted to the dissipating plate 3 through the metallic blocks 2, and then, dissipated outward through the terminal portions 11.

Connecting terminals 7 are used for fixing the above integrated dielectric substrate to a mother board (not shown in the figures).

As is mentioned above, in the above integrated dielectric substrate, one through hole 4 is made for receiving each exothermic element 5. The size of each through hole 4 is required to be large enough to insert the corresponding metallic block 2, whose top-face area is greater than that of the exothermic elements 5, with a space between the dielectric substrate 1 and the metallic block 2. Thus the size of the through holes 4 is considerably larger than the top face of the exothermic elements 5.

The size and the number of the through holes 4 made in the dielectric substrate 1 are predetermined and cannot be decreased. Therefore, when the size of the dielectric substrate 1 is reduced for achieving a compact integrated dielectric substrate, the proportional area of the through holes 4 in the dielectric substrate 1 significantly increases, resulting in the following problem: the minimum area necessary for forming the circuit patterns and for loading devices other than the exothermic elements 5 cannot be ensured, and thus achievement of compact integrated dielectric substrate becomes difficult.

In addition, when the dielectric substrate 1 has a multilayer structure in which circuit patterns are formed in each layer, the area available for forming the circuit patterns becomes small in each layer because every layer has the through holes 4. Thus, to ensure a sufficient area for forming the circuit patterns, the dielectric substrate 1 must be large, undesirably resulting in a large-sized integrated dielectric substrate.

SUMMARY OF THE INVENTION

The present invention is aimed at solving the above problems. The present invention advantageously provides a compact integrated dielectric substrate which can reliably dissipate the heat generated by exothermic elements.

To achieve the above advantages, the present invention has the following aspects:

According to a first aspect of the present invention, an integrated dielectric substrate has a dissipating plate for dissipating the heat generated by an exothermic element mounted above the surface of the dielectric substrate, in which a groove is cut through the surface of the dielectric substrate from one end to the other end of the dielectric substrate; the dissipating plate extends in the running direction of the groove and is fitted in the groove; both ends of the dissipating plate extend beyond the corresponding ends of the dielectric substrate in the running direction of the groove to form extending end portions; and the exothermic element is mounted on the surface of the dissipating plate.

According to a second aspect of the present invention, an integrated dielectric substrate has a dissipating plate for dissipating the heat generated by an exothermic element mounted above the surface of the dielectric substrate, in which a cavity is formed in an exothermic-element mounting region of the surface of the dielectric substrate; the dissipating plate is formed such that it lies from one end to the other end of the dielectric substrate across a portion containing the cavity; the ends of the dissipating plate extend beyond both ends of the dielectric substrate in the running direction of the dissipating plate to form extending end portions; a portion of the dissipating plate corresponding to the position of the cavity is concavely bent so as to fit in the cavity; and the exothermic element is mounted on the top face of the concavely bent portion of the dissipating plate.

According to a third aspect of the present invention, an integrated dielectric substrate according to the first or second aspect of the present invention has the extending end portions prepared by bending the dissipating plate along the thickness direction toward the bottom face of the dielectric substrate, and then, bending outward in parallel with the bottom face of the dielectric substrate to form parallel bent portions whose bottom faces are coplanar with the bottom face of the dielectric substrate.

According to a fourth aspect of the present invention, an integrated dielectric substrate according to the first or second aspect of the present invention has the dissipating plate composed of a top plate and L-shaped legs correspondingly fixed to both ends of the top plate, and the bottom faces of horizontal portions of the L-shaped legs are coplanar with the bottom face of the dielectric substrate.

According to one example of the present invention, the exothermic elements are mounted on the surface of the dissipating plate fitting in the groove cut through the dielectric substrate. Therefore, the heat generated by the exothermic elements can be directly conducted to the dissipating plate and dissipated outward.

Since the width of the dissipating plate (i. e., the width of the groove) can be reduced, the ratio of the area occupied by the dissipating plate to the area of the dielectric substrate can be significantly lower than that of the area occupied by the through holes to the area of a dielectric substrate in the prior art. Therefore, regions for forming circuit patterns and those for loading devices other than the exothermic elements can be enlarged, and correspondingly, the overall size of the dielectric substrate can be reduced, thereby achieving a compact integrated dielectric substrate.

In particular, when the dielectric substrate has a multi-layered structure, in each of the layers positioned below the bottom of the groove or the concave portion, the entire surface can be used as the region for forming circuit patterns because the groove or the concave portion is provided only on the top face of the dielectric substrate. The total area for forming circuit patterns can be thereby greatly enlarged, and correspondingly, the overall size of the dielectric substrate can be reduced, thereby achieving a further compact integrated dielectric substrate.

DESCRIPTION OF EMBODIMENTS OF THE INVENTION

The present invention will be better understood from the following description of embodiments thereof taken in conjunction with the accompanying drawings.

The numerals in the different views identify substantially the same parts as the same numerals in the above conventional example, and detailed explanations thereof are omitted.

First Embodiment

Figure 1A:
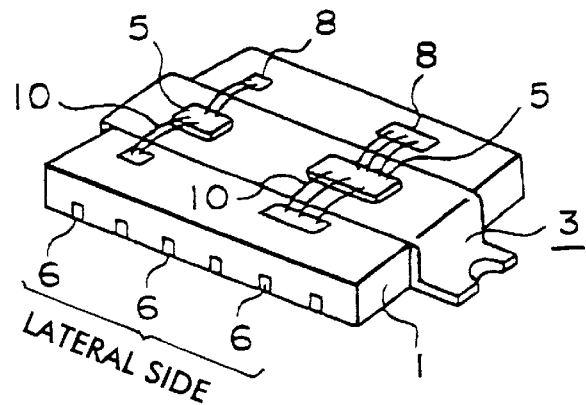
FIG. 1A is a perspective view of an integrated dielectric substrate according to a first embodiment of the present invention and FIG. 1B is a side view of the integrated dielectric substrate of FIG. 1A.
Figure 1B:
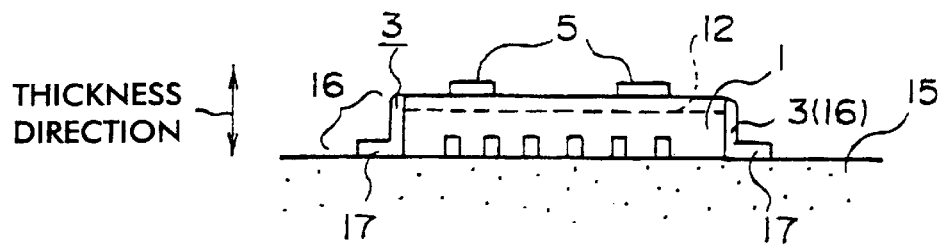
Figure 2:
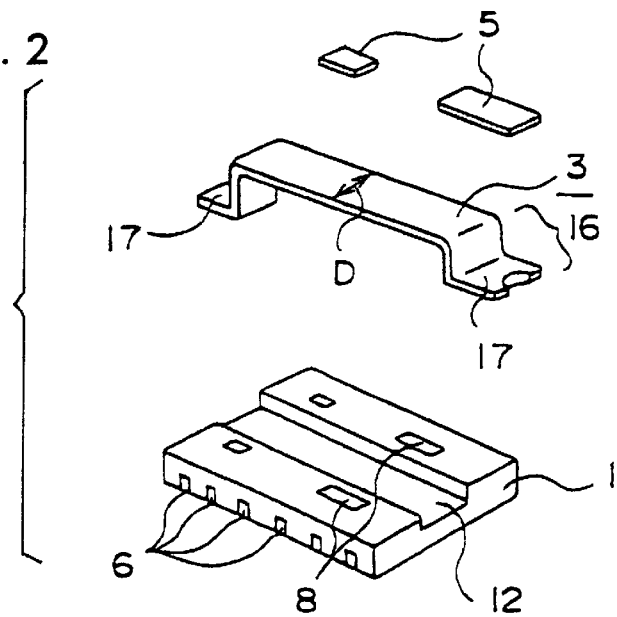
FIG. 2 is an exploded view of the integrated dielectric substrate of FIGS. 1A and 1B.

FIG. 1A is a perspective view of an integrated dielectric substrate of the first embodiment. FIG. 1B is a side view of the integrated dielectric substrate of FIG. 1A. FIG. 2 is an exploded view of the integrated dielectric substrate of FIGS. 1A and 1B.

The integrated dielectric substrate of this embodiment is composed of: a dielectric substrate 1 made of ceramic, glass epoxy, etc.; a dissipating plate 3; and exothermic elements 5. As is shown in FIG. 2, a groove 12 running from one end to the other end of the dielectric substrate 1 through the predetermined regions used for mounting the exothermic elements 5 is cut through the surface of the dielectric substrate 1. The dissipating plate 3 is fitted in the groove 12, as is shown in FIGS. 1A and 1B.

The dissipating plate 3 is formed in a strip shape fitting in the groove 12, and beyond both ends of the dielectric substrate 1, it is extended and bent along the thickness direction of the dielectric substrate 1 toward the bottom face of the dielectric substrate 1 to form extending end portions 16. As is shown in FIG. 1B, the extending end portions 16 are bent outward in parallel with the bottom face of the dielectric substrate 1 to form parallel bent portions 17, whose bottom faces are coplanar with that of the dielectric substrate for being mounted on the surface of a mother board 15 to which the integrated dielectric substrate is fixed.

The depth of the groove 12 is the same as the thickness of the dissipating plate 3 so that the surface of the dielectric substrate 1 and that of the dissipating plate 3 become coplanar when the dissipating plate 3 is fitted in the groove 12. Therefore, devices such as bare chips, or other surface mount devices other than exothermic elements 5 can be placed across the surface of the dielectric substrate 1 and that of the dissipating plate 3.

The exothermic elements 5 are mounted on the surface of the dissipating plate 3. Land patterns 8 corresponding to the exothermic elements 5 are formed on the surface of the dielectric substrate 1, except for the region having the groove 12 thereon, and are electrically connected with the exothermic elements 5 through wires 10.

In addition, terminals 6 are formed on the side faces of the dielectric substrate 1 so as to fix the dielectric substrate 1 to the mother board 15 and also to electrically connect the circuits of the dielectric substrate 1 with those of the mother board 15.

According to the first embodiment, in the integrated dielectric substrate having the above structure, the heat generated by the exothermic elements 5 is directly conducted to the dissipating plate 3 and dissipated to the mother board 15 through the extending end portions 16 of the dissipating plate 3.

The above integrated dielectric substrate is prepared as follows: The dielectric substrate 1 having the terminals 6, the land patterns 8, the groove 12, and circuit patterns (not shown in the figure); the bent dissipating plate 3; and the exothermic elements 5 are separately produced. The dissipating plate 3 is then fitted in the groove 12 of the substrate 1, the exothermic elements 5 are mounted on the surface of the dissipating plate 3, and the exothermic elements 5 and the land patterns 8 are connected through the wires 10.

Figure 8A:
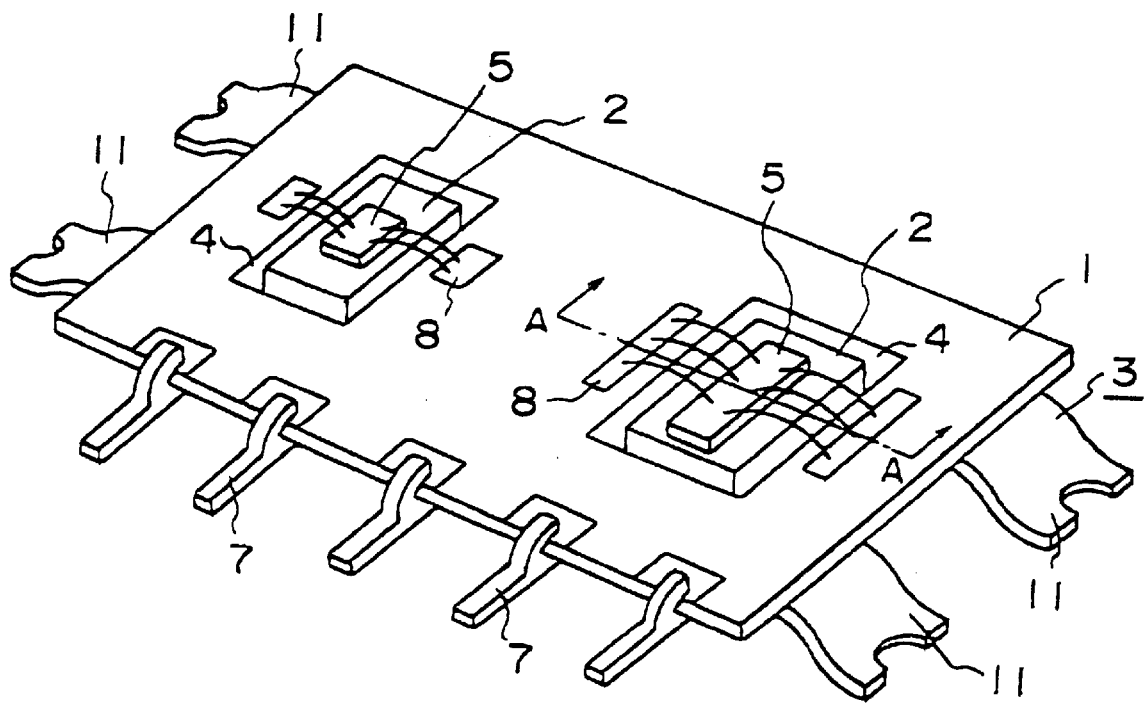
FIG. 8A is a perspective view of a conventional integrated dielectric substrate and FIG. 8B is a fragmentary cross-sectional view taken along the line A—A in FIG. 8A.
Figure 8B:
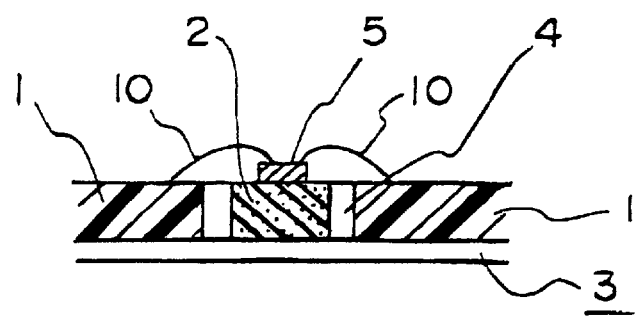

Unlike conventional integrated dielectric substrates in which a dissipating plate is set on the bottom face of the dielectric substrate, according to the first embodiment of the present invention, the exothermic elements 5 are mounted on the surface of the dissipating plate 3 provided in a groove on the top of the dielectric substrate 1. Therefore, it is not necessary to employ the metallic blocks 2 and the through holes 4 for conducting the heat generated by the exothermic elements 5 to the dissipating plate 3 provided on the bottom face of the dielectric substrate 1, which structure is shown in FIGS. 8A and 8B and is required for the conventional integrated dielectric substrates. As a result, the step for inserting the metallic blocks 2 into the corresponding through holes 4 can be omitted from the process for manufacturing the integrated dielectric substrate, thereby achieving simpler fabrication.

Furthermore, the width D of the dissipating plate 3 shown in FIG. 2, i. e., the width of the groove 12, can be reduced to almost the same as that of the exothermic elements 5. The width D of the dissipating plate 3 is so small that the ratio of the area occupied by the dissipating plate 3 to the area of the dielectric substrate 1 can be significantly lower than that of the area occupied by the through holes 4 to the area of the dielectric substrate 1 shown in FIG. 8A. Therefore, the regions for forming the circuit patterns and those for loading devices can be enlarged, and correspondingly, the size of the dielectric substrate 1 can be reduced, thereby achieving a compact integrated dielectric substrate.

Additionally, positioning of the dissipating plate 3 with respect to the dielectric substrate 1 becomes easier because the dissipating plate 3 is fitted in the groove 12 cut through the exothermic-element mounting surface of the dielectric substrate 1. Furthermore, both ends of the dissipating plate 3 extend beyond the corresponding ends of the dielectric substrate 1 and are bent along the thickness direction toward the bottom face of the dielectric substrate 1 to form the extending end portions 16. Thus, the dissipating plate 3 can be mounted on the dielectric substrate 1 with more positioning accuracy.

Moreover, each of the extending end portions 16 is bent in parallel with the bottom face of the dielectric substrate 1 so as to form a parallel bent portion 17 whose bottom face is coplanar with the bottom face of the dielectric substrate 1. Thus, the integrated dielectric substrate can be mounted on the surface of the mother board 15 in a manner similar to surface mount devices. In addition, since the entire bottom face of each of the parallel bent portions 17 is in contact with the surface of the mother board 15, the heat generated by the exothermic elements 5 can be efficiently conducted to the mother board 15.

Furthermore, when the dielectric substrate 1 has a multi-layered structure, the groove 12 is cut only through the surface of the dielectric substrate 1. Thus, in each of the layers positioned below the bottom of the groove 12, the entire surface can be used for forming circuit patterns because no through hole 4 is made therein. As a result, the regions for forming circuit patterns on the dielectric substrate 1 can be greatly enlarged and correspondingly, the overall size of the integrated dielectric substrate can be reduced.

Since conventional integrated dielectric substrates have a two-layered structure composed of the dielectric substrate 1 and the dissipating plate 3, they are thick. According to this embodiment of the present invention, the surface of the dielectric substrate 1 is coplanar with that of the dissipating plate 3, and also, the bottom faces of the parallel bent portions 17 are coplanar with that of the dielectric substrate 1. Therefore, the thickness of the integrated dielectric substrate is almost the same as that of the dielectric substrate 1, thereby readily achieving a compact integrated dielectric substrate.

Second Embodiment

Figure 3A:
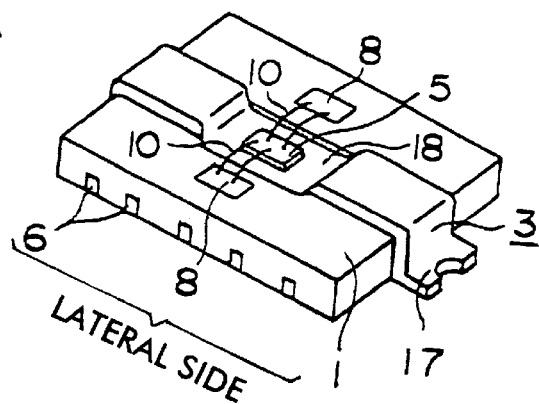
FIG. 3A is a perspective view of an integrated dielectric substrate according to a second embodiment of the present invention and FIG. 3B is a side view of the integrated dielectric substrate of FIG. 3A.
Figure 3B:
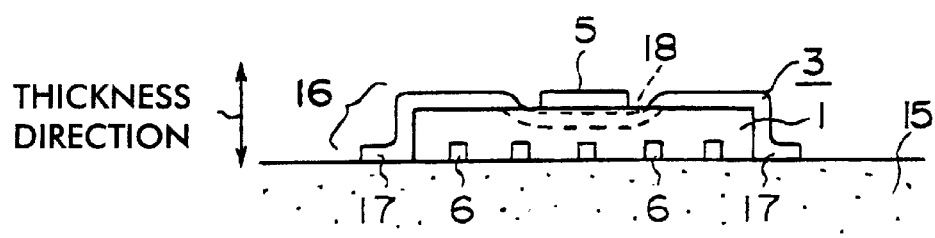
Figure 4:
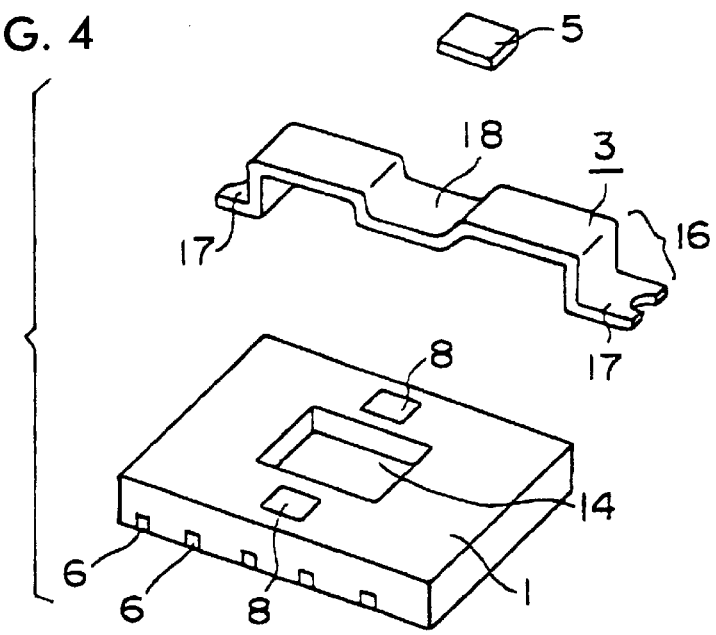
FIG. 4 is an exploded view of the integrated dielectric substrate of FIGS. 3A and 3B.

A second embodiment of the present invention will be explained in detail below. FIG. 3A is a perspective diagram of an integrated dielectric substrate of the second embodiment. FIG. 3B is a side view of the integrated dielectric substrate of FIG. 3A. FIG. 4 is an exploded diagram of the integrated dielectric substrate of FIGS. 3A and 3B.

The integrated dielectric substrate of the second embodiment is characterized in that instead of the groove 12 of the first embodiment, a cavity 14 (i. e. a concave portion) is formed in a region of the dielectric substrate 1 on which the exothermic element 5 is to be mounted, and the dissipating plate 3 lies from one end to the other end of the dielectric substrate 1 across the portion containing the cavity 14. Except for the above, the structure of the second embodiment is identical to that of the first embodiment, and the explanation thereof is omitted.

As is mentioned above, the cavity 14 is set up in the exothermic-element mounting region of the dielectric substrate 1. The dissipating plate 3 is formed in a strip shape from one end to the other end of the dielectric substrate 1 across the portion containing the cavity 14. As is shown in FIG. 4, a portion of the dissipating plate 3 corresponding to the position of the cavity 14 is formed into a concavely bent portion 18 fitting in the cavity 14. The exothermic element 5 is mounted on the top face of the concavely bent portion 18, and via the wires 10, is connected to the land patterns 8 formed on the surface of the dielectric substrate 1, as is shown in FIGS. 3A and 3B.

According to this embodiment of the present invention, the exothermic element 5 is mounted on the surface of the dissipating plate 3 provided on the dielectric substrate 1. Therefore, the conventional metallic blocks 2 and through holes 4 are not required for the dielectric substrate 1. The width of the dissipating plate 3 can be reduced to almost the same as that of the exothermic element 5. Therefore, a compact integrated dielectric substrate can be readily achieved, as is similar to the first embodiment.

Additionally, because of the cavity 14, positioning of the dissipating plate 3 with respect to the dielectric substrate 1 becomes easier and results in improved mounting accuracy. Moreover, since the extending end portions 16 of the dissipating plate 3 extend beyond the corresponding ends of the dielectric substrate 1 and are bent along the thickness direction toward the bottom face of the dielectric substrate 1, the dissipating plate 3 can be mounted on the dielectric substrate 1 with more accuracy.

In addition, since the bottom face of each of the parallel bent portions 17 and that of the dielectric substrate 1 are allowed to be coplanar, the integrated dielectric substrate can be mounted onto the surface of the mother board 15 as one surface mount device, and also, the heat generated by the exothermic element 5 can be efficiently conducted to the mother board 15, as is similar to the first embodiment.

Modifications

Figure 5A:
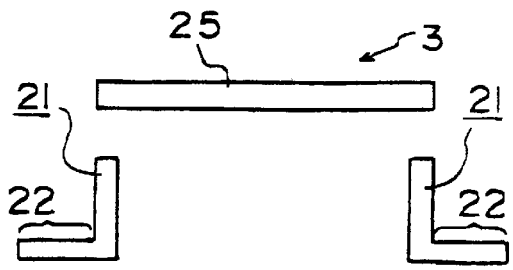
FIGS. 5A and 5B are diagrams explaining a modification of the dissipating plate of the first embodiment.
Figure 5B:
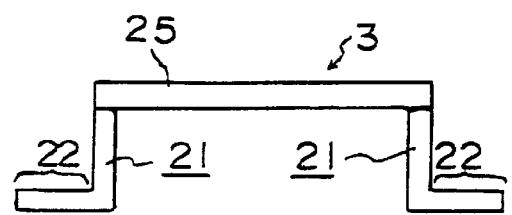
Figure 6A:
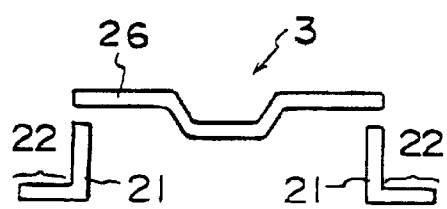
FIGS. 6A and 6B are diagrams explaining a modification of the dissipating plate of the second embodiment.
Figure 6B:
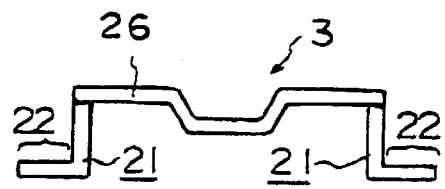
Figure 7A:
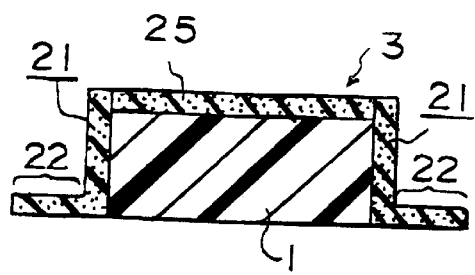
FIG. 7A is a diagram explaining a further modification of the dissipating plate of the first embodiment.
Figure 7B:
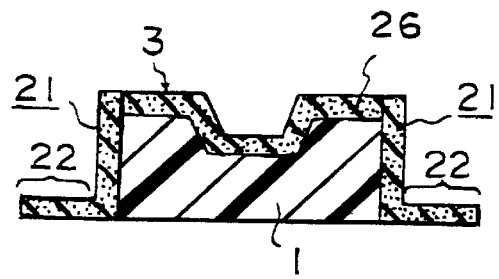
FIG. 7B is a diagram explaining a further modification of the dissipating plate of the second embodiment.

The present invention is not restricted to the above embodiments, and variations and modifications can be effected within the spirit and scope of the invention. For example, although the dissipating plate 3 is prepared by bending one strip-shaped plate in each of the above embodiments, it may be composed of separate members such as a top plate 25 or 26 and L-shaped legs 21, as shown respectively in FIGS. 5A and 6A. In such cases, the legs 21 are fixed respectively to the underside of the top plate 25 or 26 at its ends, to form the dissipating plate 3, as shown in FIGS. 5B, 6B. Alternatively, the legs 21 may be fixed respectively to the ends of the top plate 25 or 26, as shown in FIGS. 7A and 7B.

The top plate 25 or 26 corresponds to the top-plate portion, i. e., the portion fixed to the surface of the dielectric substrate 1, of the dissipating plate 3 in the first and second embodiments. The exothermic elements 5 are mounted on the surface of the top plate 25 or 26 as the first and second embodiments.

Furthermore, the L-shaped legs 21 correspond to the extending end portions 16 of the dissipating plate 3 of the first and second embodiments. For example, the L-shaped legs 21 are formed such that the bottom face of the horizontal portion 22 of each of the legs 21 and that of the dielectric substrate 1 become coplanar when the dissipating plate 3 composed of the top plate 25 or 26 and the legs 21 is fixed to the dielectric substrate 1.

Although the depth of the groove 12 is almost the same as the thickness of the dissipating plate 3 in the first embodiment, the depth of the groove 12 may differ from the thickness of the dissipating plate 3 in these modifications. In addition, although the exothermic element 5 is formed on the top face of the concavely bent portion 18 of the dissipating plate 3 in the second embodiment, it may also be formed, according to a modification of the present invention, on a surface region of the dissipating plate 3 other than the concavely bent portion 18.

According to the disclosed embodiments of the invention, exothermic elements are mounted on the surface of a dissipating plate provided on a dielectric substrate. Therefore, it is not necessary to make conventional through holes in the dielectric substrate, and also the width of the dissipating plate can be reduced to almost the same as that of the exothermic elements. As a result, the ratio of the area occupied by the dissipating plate to the area of the dielectric substrate can be significantly lower than the ratio of the area occupied by the through-holes to the area of the dielectric substrate of the conventional example. Therefore, the size of the dielectric substrate can be reduced while ensuring the minimum required regions for forming the circuit patterns and loading devices, thereby achieving a compact integrated dielectric substrate.

By providing a groove or a concave portion on the surface of the dielectric substrate, positioning of the dissipating plate with respect to the dielectric substrate becomes easier. Thus, the time required for mounting the dissipating plate to the dielectric substrate can be shortened.

Furthermore, according to the disclosed embodiments of the invention, no through hole is required for the dielectric substrate, and also, the groove or the concave portion is formed on only the top face of the dielectric substrate. Therefore, when the dielectric substrate has a multi-layered structure, in each of the layers positioned below the bottom of the groove or the concave portion, the entire surface can be used for forming circuit patterns. The regions for forming circuit patterns can be thereby greatly enlarged, and correspondingly, the overall size of the integrated dielectric substrate can be reduced.

Furthermore, positioning accuracy for mounting the dissipating plate on the dielectric substrate can be improved by employing the parallel bent portions or the L-shaped legs.

Moreover, since the bottom faces of the parallel bent portions and those of horizontal portions of the L-shaped legs are coplanar with the bottom face of the dielectric substrate, the integrated dielectric substrate can be mounted on the surface of a substrate, e. g., a mother board, as one surface mount device. In addition, the heat generated by the exothermic elements can be efficiently conducted to the mother board, etc. because the entire bottom faces of the parallel bent portions and those of the horizontal portions of the L-shaped legs are in contact with the surface of the mother board, etc.

What is claimed is:

1. In combination, an exothermic element and an integrated dielectric substrate comprising a dissipating plate for dissipating the heat generated by the exothermic element mounted above a surface of said dielectric substrate, said surface of said dielectric substrate having an exothermic-element mounting region with a cavity formed therein, said dissipating plate lying on said dielectric substrate across a portion containing said cavity with a portion of said dissipating plate corresponding to the position of said cavity being concavely bent so as to fit in said cavity, the ends of the dissipating plate extending beyond said dielectric substrate to form extending end portions, and said exothermic element being mounted on said dissipating plate.

2. The combination as set forth in claim 1, wherein said exothermic element is mounted on said concavely bent portion of said dissipating plate.

3. An integrated dielectric substrate comprising a dielectric substrate and a dissipating plate for dissipating the heat generated by an exothermic element mounted above a top surface of said dielectric substrate, said top surface of said dielectric substrate having circuit patterns and a cut therein, said dissipating plate being fitted in said cut and having its ends extending beyond said dielectric substrate to form extending end portions, said exothermic element mounted to said plate.

4. An integrated dielectric substrate as set forth in claim 3, wherein said cut in said dielectric substrate comprises a groove formed from end to end of said dielectric substrate, said dissipating plate being fitted into said groove.

5. An integrated dielectric substrate as set forth in claim 3, wherein said cut in said dielectric substrate comprises a cavity formed in said surface of said dielectric substrate, said dissipating plate having a concavely bent portion which is fitted into said cavity.

6. A combination, comprising:

a dielectric substrate having a groove formed in an upper surface thereof;

a heat dissipating plate extending across said upper surface of said substrate and beyond opposite lateral edges of said substrate, said heat dissipating plate being fitted in said groove;

an exothermic element mounted on said heat dissipating plate.

7. The combination as set forth in claim 6 or claim 1, wherein said extending end portions of said dissipating plate are bent along the thickness direction of said dielectric substrate toward the bottom face of said dielectric substrate, and then, bent outward in parallel with the bottom face of said dielectric substrate to form parallel bent portions so that the bottom faces of said parallel bent portions are coplanar with the bottom face of said dielectric substrate.

8. The combination as set forth in claim 6 or claim 1, wherein said dissipating plate is composed of a top plate and a pair of L-shaped legs respectively fixed to ends of said top plate, and bottom faces of horizontal portions of said L-shaped legs are coplanar with the bottom face of said dielectric substrate.

9. The combination as set forth in claim 6 or claim 1, wherein said dissipating plate extends from one end to the other end of said dielectric substrate and said extending end portions extend beyond both ends of said dielectric substrate.

10. The combination as set forth in claim 6 or claim 1, wherein a top surface of said dissipating plate is coplanar with said top surface of said dielectric substrate.

11. The combination as set forth in claim 6 or claim 1, wherein said dielectric substrate has multiple layers with at least one circuit pattern being on a corresponding layer within said dielectric substrate and under said exothermic element.

12. The combination of claim 6, wherein said groove extends across said upper surface of said dielectric substrate between said opposite lateral edges.

13. The combination of claim 6, wherein said groove extends only across a portion of said upper surface of said dielectric substrate and does not extend between said opposite lateral edges.

14. The combination of claim 6, further including a plurality of land patterns formed on said upper surface of said dielectric substrate, at least some of said land patterns being electrically coupled to said exothermic element.

15. The combination of claim 6, wherein a plurality of exothermic elements are mounted on said heat dissipating plate.

16. The combination of claim 15, further including a plurality of land patterns formed on said upper surface of said dielectric substrate, at least some of said land patterns being electrically coupled to respective ones of said exothermic elements.

17. The combination of claim 6, wherein said upper surface is generally planar in shape and said groove has a depth as measured in a direction perpendicular to said planar upper surface of said dielectric substrate and wherein the thickness of said heat dissipating plate as measured along the same direction is substantially equal to said depth of said groove.

18. The combination of claim 6, wherein said upper surface of said dielectric substrate is generally rectangular in shape and has a length and a width and wherein said heat dissipating plate extends across one of said length and width and not across the other of said length and width.

19. The combination of claim 18, wherein said heat dissipating plate extends across said length of said upper surface of said dielectric substrate.

20. The combination of claim 6, wherein said heat dissipating plate is generally in the form of a rectangular parallelpiped.

21. The combination of claim 20, wherein said groove is generally in the form of a rectangular parallelpiped having a depth which is less than a depth of said dielectric substrate and a width which is less than the width of said dielectric substrate.

22. The combination of claim 21, wherein said groove has a length which is equal to a length of said dielectric substrate.

23. The combination of claim 21, wherein said groove has a length which is less than a length of said dielectric substrate.

24. The combination of claim 20, wherein said heat dissipating plate extends across said upper surface of said dielectric substrate, down opposite side surfaces of said dielectric substrate and away from said opposite side surfaces of said dielectric substrate.

25. The combination of claim 24, wherein said heat dissipating plate is formed of a single piece.

26. The combination of claim 25, wherein said heat dissipating plate is formed of several pieces.

27. The combination of claim 13, wherein said heat dissipating plate extends across a portion of said upper surface of said dielectric substrate, down into said groove and then back across a different portion of said upper surface of said dielectric substrate.

28. The combination of claim 6, wherein the width of said dissipating plate is substantially equal to the width of said exothermic element.

29. The combination of claim 14, wherein the width of said dissipating plate is substantially equal to the width of said exothermic elements.

30. The combination of claim 14, wherein the width of said dissipating plate is substantially equal to the width of the widest of said exothermic elements.

* * * * *